(12) United States Patent
Müllner

(10) Patent No.: US 11,522,122 B2
(45) Date of Patent: Dec. 6, 2022

(54) CIRCULAR MAGNETIC FIELD GENERATOR AND PUMP

(71) Applicant: BOISE STATE UNIVERSITY, Boise, ID (US)

(72) Inventor: Peter Müllner, Boise, ID (US)

(73) Assignee: Boise State University, Boise, ID (US)

(*) Notice: Subject to any disclaimer, the term of this patent is extended or adjusted under 35 U.S.C. 154(b) by 773 days.

(21) Appl. No.: 16/545,632

(22) Filed: Aug. 20, 2019

(65) Prior Publication Data
US 2020/0066965 A1 Feb. 27, 2020

Related U.S. Application Data

(60) Provisional application No. 62/720,253, filed on Aug. 21, 2018.

(51) Int. Cl.
*H01L 41/12* (2006.01)
*F02M 21/02* (2006.01)
*G12B 1/02* (2006.01)

(52) U.S. Cl.
CPC ......... *H01L 41/12* (2013.01); *F02M 21/0242* (2013.01); *G12B 1/02* (2013.01)

(58) Field of Classification Search
CPC ....... H01L 41/12; F02M 21/0242; G12B 1/02
USPC .......................................................... 310/26
See application file for complete search history.

*Primary Examiner* — Emily P Pham
*Assistant Examiner* — Monica Mata
(74) *Attorney, Agent, or Firm* — Parsons Behle & Latimer

(57) ABSTRACT

A system may include a magnetic shape memory (MSM) element having a long axis that extends from a first end of the MSM element to a second end of the MSM element. The system may further include a first solenoid, where a longitudinal axis of the first solenoid is positioned at a first angle relative to the long axis of the MSM element. The system may also include a second solenoid, where a longitudinal axis of the second solenoid is positioned at a second angle relative to the long axis of the MSM element and at a third angle relative to the longitudinal axis of the first solenoid, where the longitudinal axis of the first solenoid and the longitudinal axis of the second solenoid are not parallel.

21 Claims, 8 Drawing Sheets

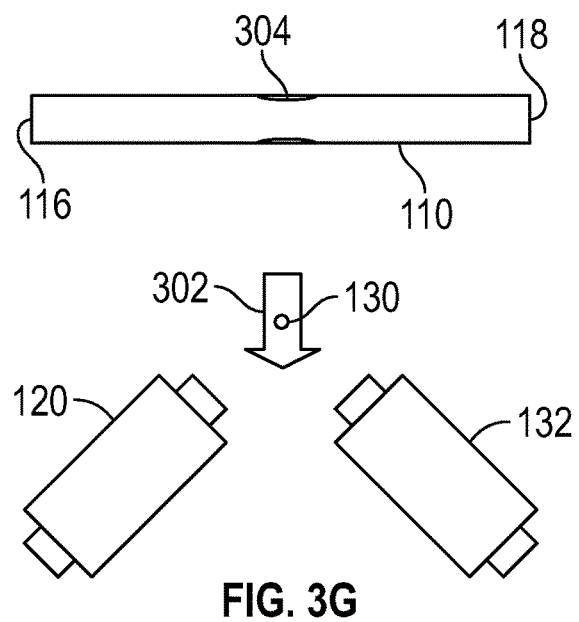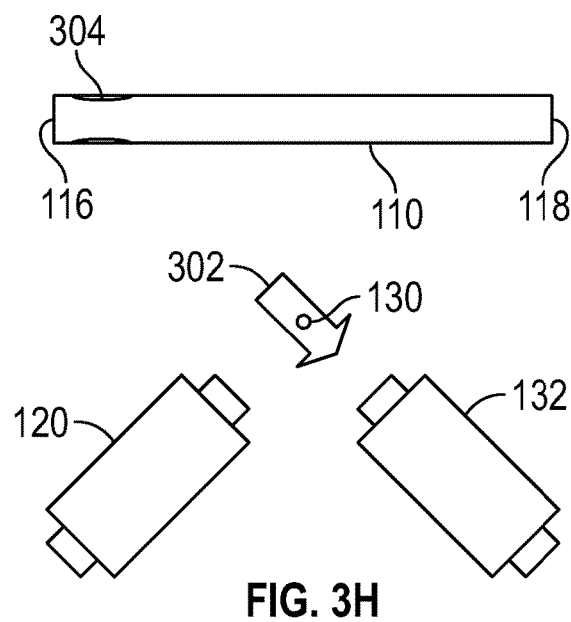

CIRCULAR MAGNETIC FIELD GENERATOR AND PUMP

CROSS-REFERENCE TO RELATED APPLICATIONS

This application claims the benefit of and priority to U.S. Provisional Patent Application No. 62/720,253, filed on Aug. 21, 2018, and entitled "Circular Magnetic Field Generator and Pump," the contents of which are hereby incorporated by reference herein in their entirety.

FIELD OF THE DISCLOSURE

This disclosure is generally related to the field of electromagnetic actuation, and, in particular, to magnetic field generation for magnetic shape memory (MSM) based actuation.

BACKGROUND

MSM alloys (MSMAs), which may deform strongly when subjected to a variable magnetic field, may be useful for micro-actuation purposes. For example, MSM alloys may be used in micropumps where it is desirable to transmit small volumes (e.g., sub-microliter volumes) of fluid from one location to another, such as delivering small doses of drugs to a subject over a period of time. An MSM micropump may operate by local variations of the magnetic field, thereby reducing a volume of the pump and increasing the energy efficiency of the pump. In other examples, MSM elements may be used for actuating valves, manifolds, or other devices.

Some MSM actuation devices may generate the local variations in the magnetic field using a rotating permanent magnet. In other cases, in order to reduce the size and weight of an MSM actuation device, instead of using a permanent magnet for actuation, a set of magnetic coils may generate a variable magnetic field. The arrangement of the coils may be simple, such as a linear arrangement. The local magnetic field may be varied by changing the polarity of individual coils. Likewise, a combination of coils and permanent magnets may be used to reduce an amount of current density that is passed through the coils.

However, MSM actuation devices with permanent magnets may be heavy and bulky and may not be suitable for some applications. On the other hand, devices with several linearly placed electrical coils and controllers to reverse the current in individual coils may increase the complexity and costs associated with manufacturing MSM actuation devices. Further, a device that employs several electrical coils to produce a magnetic field may rely on additional cooling devices that may add weight and/or circuitry to the system. Other disadvantages may exist.

SUMMARY

Described herein are embodiments of a simplified system and method for actuating an MSM element with electromagnetic coils (e.g., solenoids). In some embodiments, a system may include two coils mutually at an angle of 90° and each at an angle of 45° with respect to a long axis of the MSM element. In some embodiments, each coil may be powered with an alternating current (AC) current where the current of one coil has a phase shift of 90° with respect to the current of the other coil. In this way, the net magnetic field at the center of the MSM element may rotate with the frequency of the AC current. The two solenoids may be used instead of a rotating diametrically magnetized permanent magnet, and instead of linearly placed electric coils.

In an embodiment, a system includes an MSM element having a long axis that extends from a first end of the MSM element to a second end of the MSM element. The system further includes a first solenoid, where a longitudinal axis of the first solenoid is positioned at a first angle relative to the long axis of the MSM element. The system also includes a second solenoid, wherein a longitudinal axis of the second solenoid is positioned at a second angle relative to the long axis of the MSM element and at a third angle relative to the longitudinal axis of the first solenoid, where the longitudinal axis of the first solenoid and the longitudinal axis of the second solenoid are not parallel.

In some embodiments, the system includes a controller configured to apply a first AC signal to the first solenoid and a second AC signal to the second solenoid, where the first AC signal and the second AC signal produce a combined rotating magnetic flux that causes a localized neck to form in the MSM element and to move from the first end to the second end. In some embodiments, the first AC signal and the second AC signal have a same amplitude and a same frequency, and the first AC signal and the second AC signal have a substantially 90° phase difference. In some embodiments, the first angle is between 30° and 60°, the second angle is between 30° and 60°, and the third angle is between 60° and 120°. In some embodiments, the first angle is 45°, the second angle is 45°, and the third angle is 90°. In some embodiments, the longitudinal axis of the first solenoid and the longitudinal axis of the second solenoid intersect at a point proximate to the MSM element. In some embodiments, the system includes one or more additional solenoids, where longitudinal axes of the additional solenoids are positioned at additional angles relative to the long axis of the MSM element. In some embodiments, the one or more additional solenoids includes two solenoids positioned symmetrically with the first solenoid and the second solenoid. In some embodiments, the one or more additional solenoids includes two solenoids positioned asymmetrically with the first solenoid and the second solenoid.

In an embodiment, a system includes an MSM element having a long axis that extends from a first end of the MSM element to a second end of the MSM element. The system further includes a first solenoid, wherein a longitudinal axis of the first solenoid is positioned at a first angle between 30° and 60° relative to the long axis of the MSM element. The system also includes a second solenoid, wherein a longitudinal axis of the second solenoid is positioned at a second angle between 30° and 60° relative to the long axis of the MSM element and at a third angle between 60° and 120° relative to the longitudinal axis of the first solenoid, where the longitudinal axis of the first solenoid and the longitudinal axis of the second solenoid intersect at a point proximate to the MSM element.

In some embodiments, the system includes a pump housing having an inlet and an outlet, where the long axis of the MSM element extends from the inlet to the outlet. In some embodiments, the system includes a controller configured to apply a first AC signal to the first solenoid and a second AC signal to the second solenoid, where the first AC signal and the second AC signal produce a combined rotating magnetic flux that, rotates around the point and causes a localized neck to form in the MSM element and to move from the first end of the MSM element to the second end of the MSM element. In some embodiments, the first AC signal and the second AC signal have a same amplitude and a same frequency, and the first AC signal and the second AC signal have a substantially 90° phase difference. In some embodiments, the first angle is 45°, the second angle is 45°, and the third angle is 90°.

In an embodiment, a method includes applying a first AC signal to a first solenoid, where a longitudinal axis of the first solenoid is positioned at a first angle relative to a long axis of an MSM element. The method further includes applying a second AC signal to a second solenoid, where a longitudinal axis of the second solenoid is positioned at a second angle relative to the long axis of the MSM element and at a third angle relative to the longitudinal axis of the first solenoid, where the longitudinal axis of the first solenoid and the longitudinal axis of the second solenoid intersect at a point proximate to the MSM element, and where the first AC signal and the second AC signal produce a combined rotating magnetic flux at the point.

In some embodiments, the method includes forming a neck in the MSM element in response to the combined rotating magnetic flux and moving the neck from a first end of the MSM element to a second end of the MSM element. In some embodiments, the long axis of the MSM element extends from an inlet of a pump housing to an outlet of the pump housing, and the method includes moving the neck from the inlet to the outlet. In some embodiments, the method includes moving a fluid from the inlet to the outlet using the neck. In some embodiments, the first AC signal and the second AC signal have a same amplitude and a same frequency, and the method includes shifting the first AC signal or the second AC signal to produce a substantially 90° phase difference between the first AC signal and the second AC signal. In some embodiments, the method includes applying one or more additional AC signal to one or more additional solenoids.

BRIEF DESCRIPTION OF THE DRAWINGS

FIGS. 3A-3H are schematic diagrams depicting a rotation of a combined magnetic flux at various times associated with the first and second normalized magnetic fields of FIG. 2.

Figure 1:
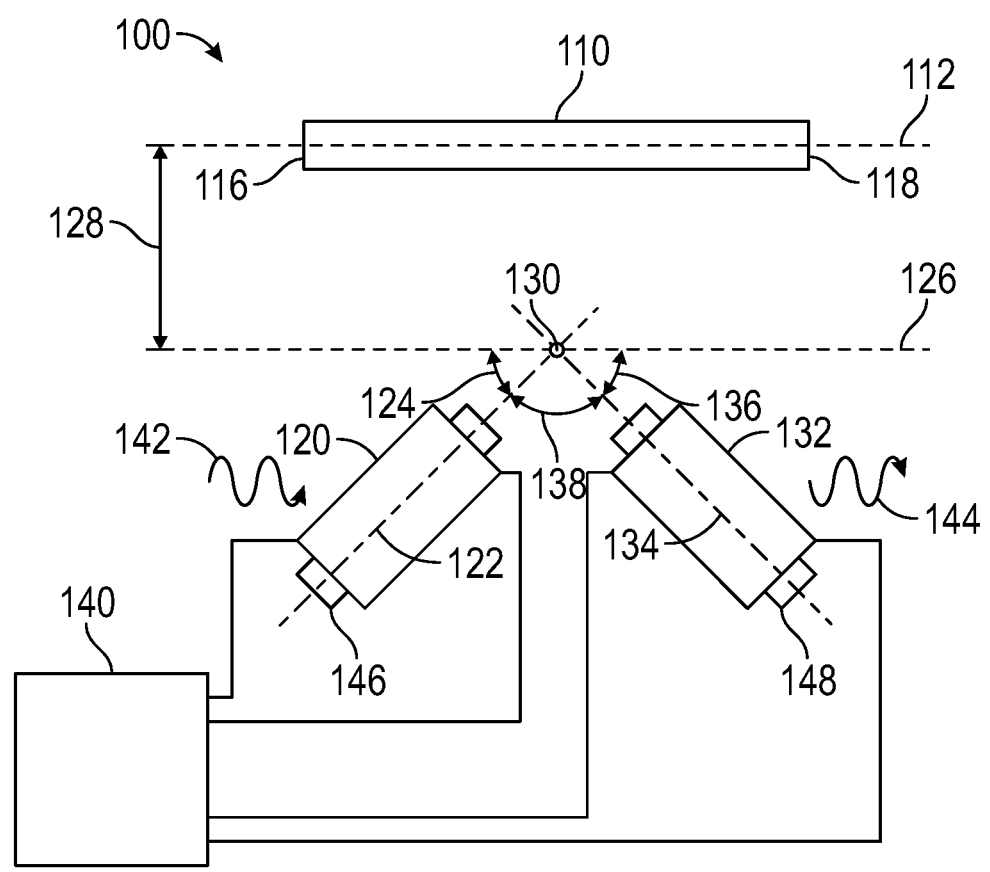
FIG. 1 is a schematic diagram depicting an embodiment of an MSM actuation system.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Examples of micro-actuation using an MSM element and examples of micropumps that operate by local variations in s magnetic field are described in U.S. Pat. No. 9,091,251, filed on Jul. 16, 2012 and entitled "Actuation Method and Apparatus, Micropump, and PCR Enhancement Method," U.S. patent application Ser. No. 14/493,674, filed on Sep. 23, 2014, published as U.S. Patent App. Publication No. 2016/0087553, and entitled "Electrically Driven Magnetic Shape Memory Apparatus and Method," and U.S. patent application Ser. No. 15/086,610, filed on Mar. 31, 2016, published as U.S. Patent App. Publication No. 2016/0211065, and entitled "Electrically Driven Magnetic Shape Memory Apparatus and Method," the contents of each of which are hereby incorporated by reference herein in their entirety. Some traits and properties of the MSM materials and elements described herein may correspond to and be substantially similar to the traits and properties of MSM materials and elements described in the above applications as would be appreciated by persons of skill in the art having the benefit of this disclosure. Likewise, specific traits and properties relating embodiments of a micropump described herein may correspond to and be substantially similar to some traits and properties of micropumps described in the above applications as would be appreciated by persons of skill int the art having the benefit of this disclosure.

Referring to FIG. 1, an embodiment of an MSM actuation system 100 is depicted. The system 100 may include an MSM element 110, which may be an elongated bar or wire of MSM material having a first end 116 and a second end 118. A long axis 112 may run along the length of the MSM element 110 from the first end 116 to the second end 118.

The system 100 may include a first solenoid 120 and a second solenoid 132. The first solenoid 120 may have a first longitudinal axis 122 and the second solenoid 132 may have a second longitudinal axis 134. Both of the solenoids may optionally have cores 146, 148, which may be made of iron, other magnetic materials, or other types of solenoid core material.

The longitudinal axis 122 of the first solenoid 120 and the longitudinal axis 134 of the second solenoid 132 may intersect at a point 130. The point 130 may be proximate to the MSM element 110. As used herein, the term proximate means that a distance 128 between the point 130 and the long axis 112 of the MSM element 110 is such that a combined magnetic field produced by the solenoids 120, 132 at the point 130 is sufficiently strong at the MSM element 110 to leverage a twinning property of the MSM element 110, thereby resulting in a localized compressed portion (or neck) at the MSM element 110 as described further herein. The point 130 may be closer to or further from the MSM element depending on the magnitude of an electrical current within the solenoids 120, 132, and depending on a particular application of the system 100. In some embodiments, the point 130 may be inside the MSM element 110 and/or may coincide with the long axis 112 of the MSM element. A parallel axis 126 is shown in FIG. 1 to aid in demonstrating angles between the solenoids 120, 132 and the MSM element 110.

The longitudinal axis 122 of the first solenoid 120 may be positioned at a first angle 124 relative to the long axis 112 of the MSM element 110. The longitudinal axis 134 of the second solenoid 132 may be positioned at a second angle 136 relative to the long axis 112 of the MSM element 110 and at a third angle 138 relative to the longitudinal axis 122 of the first solenoid 120. As depicted in FIG. 1, the longitudinal axis 122 of the first solenoid 120 and the longitudinal axis 134 of the second solenoid 132 may not be parallel. By not being parallel, the solenoids 120, 132 may produce a rotating magnetic flux when AC signals 142, 144 having different phases are simultaneously applied to the solenoids 120, 132. The exact shape and consistency of the rotating magnetic flux may depend on the angles 124, 136, 138 and on the specific waveforms of the AC signals 142, 144.

To produce a relatively constant magnitude and consistent rotation of the combined magnetic flux, the first angle 124 may be between 30° and 60°, the second angle may be between 30° and 60°, and the third angle may be between 60° and 120°. In order to produce a substantially constant magnitude and consistent rotation, the first angle may be 45°, the second angle may be 45°, and the third angle may be 90°.

The system 100 may include a controller 140 configured to apply a first AC signal 142 to the first solenoid 120 and a second AC signal 144 to the second solenoid 132. The AC signals 142, 144 may produce a combined rotating magnetic flux that causes a localized neck to form in the MSM element 110 and to move from either the first end 116 of the MSM element 110 to the second end 118 or from the second end 118 to the first end 116. In order to produce this effect, the first AC signal 142 and the second AC signal 144 may have a same amplitude and a same frequency, while having a substantially 90° phase difference. As used herein, the term 'substantially" means that the phase shift is optimized towards creating a rotating magnetic field and moving a shrinkage through the MSM element. As a guideline for the phases in this application, the deviation from an exactly 90° phase shift may be within 20° in any direction.

The controller 140 may include any type of circuitry or processing elements to produce the AC signals 142, 144. Types of circuitry may include switches, amplifiers, modulators, demodulators, and the like. Types of processing elements may include a central processing unit (CPU), a digital signal processor (DSP), a peripheral interface controller (PIC), and/or another type of processing element. In an embodiment, the controller 140 may receive the first AC signal 142 and may generate the second AC signal 144 by phase shifting the first AC signal 142. Then, both signals may be sent to their respective solenoids 120, 132.

Figure 2:
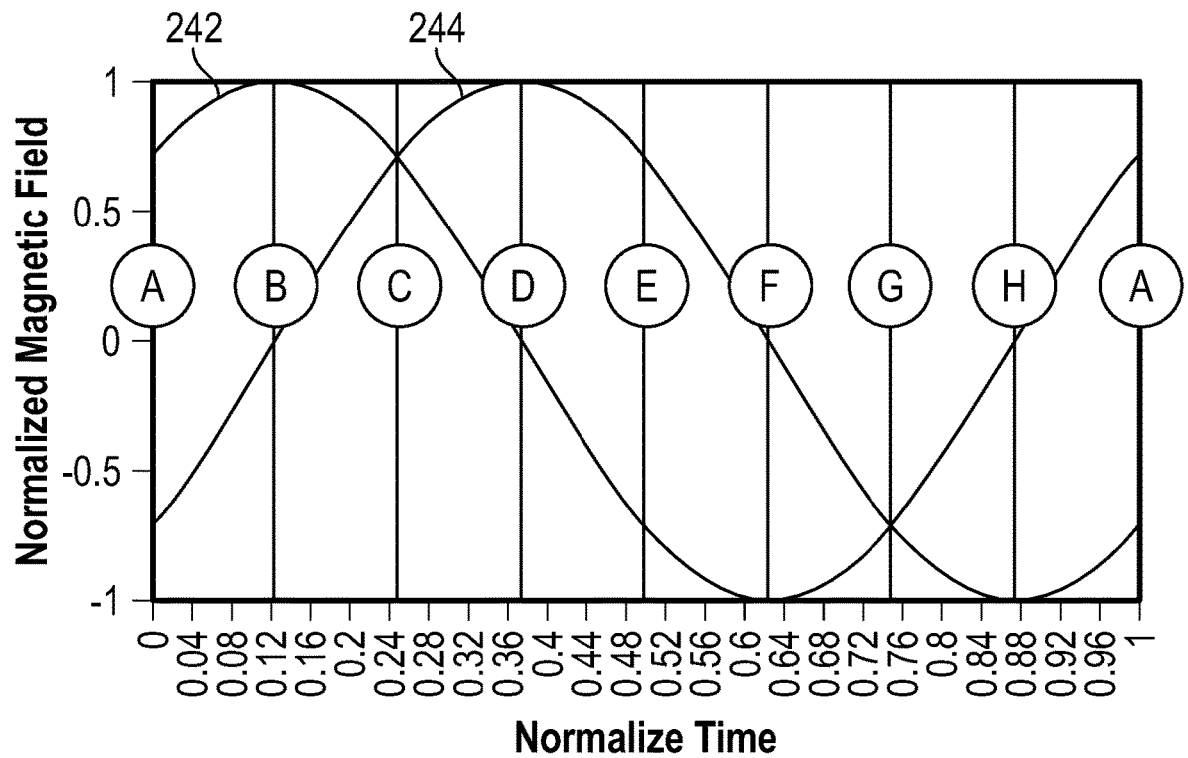
FIG. 2 is a graph depicting a first normalized magnetic field at a first solenoid and a second normalized magnetic field at a second solenoid.

FIGS. 2 and 3A-3H demonstrate a full rotation of a combined magnetic flux at the point 130. FIG. 2 depicts a first normalized magnetic field 242 at the first solenoid 120 and a second normalized magnetic field 244 at the second solenoid 132. The first normalized magnetic field 242 may be generated by the first AC signal 142 and the second normalized magnetic field 244 may be generated by the second AC signal 144. As shown in FIG. 2, the normalized magnetic fields 242, 244 may have a phase difference of substantially 90° (noting that the waveform peaks are offset by ¼ of the wavelength). As can be seen in FIGS. 2 and 3A-3H, the AC signals 142, 144 may produce a combined rotating magnetic flux that, rotates around the point 130 and causes a localized neck to form in the MSM element 110 and to move from one end of the MSM element 110 to the other (e.g., from the first end 116 to the second end 118 or from the second end 118 to the first end 116 depending on a direction of the phase difference between the AC signals 142, 144). For the purposes of this disclosure, the direction of rotation and the labeling of the ends 116, 118 may be arbitrary.

Figures 3A, 3B:
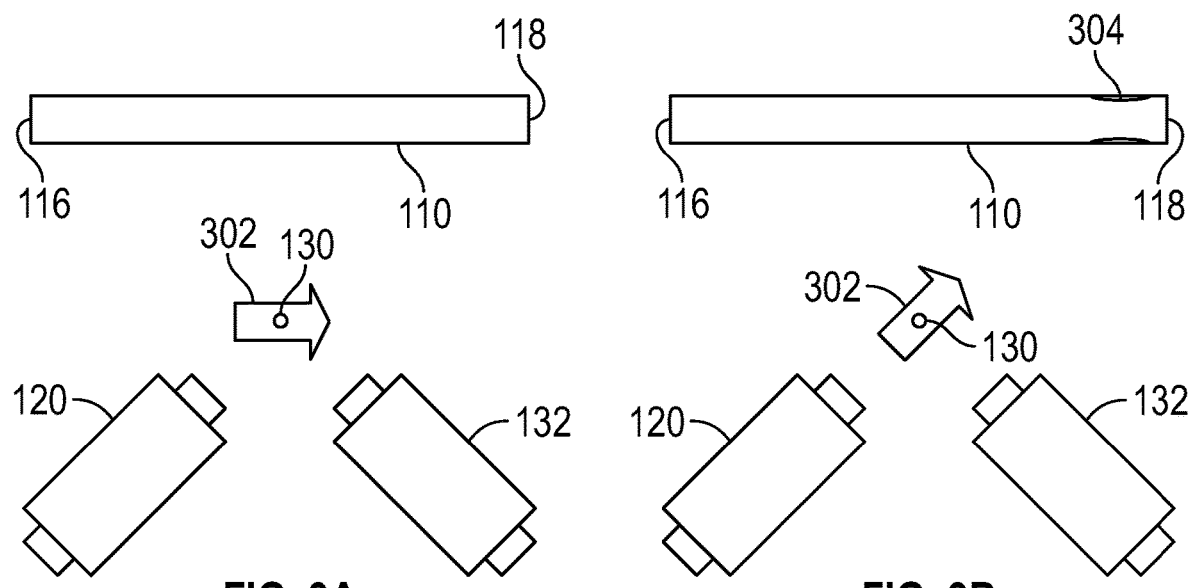

Referring to FIG. 3A, a predominant direction 302 of a combined rotating magnetic field is depicted for the time labeled A in FIG. 2. The combined rotating magnetic field may be generated by the solenoids 120, 132 and may rotate about the point 130. At the time labeled A, the first normalized magnetic field 242 may have an approximate value of √2/2 (0.707) in a direction toward the MSM element 110 and the second normalized magnetic field 244 may have an approximate value of −√2/2 (−0.707) in a direction away from the MSM element. The vector combination of the normalized magnetic fields 242, 244 may result in the predominant direction 302 being horizontal to the MSM element (i.e., with the vertical components of the normalized magnetic fields 242, 244 canceling) and running from the first end 116 of the MSM element 110 to the second end 118 of the MSM element (i.e., with the horizontal components of the normalized magnetic fields 242, 244 combining). Because the predominant direction 302 of the combined rotating magnetic field is parallel to the MSM element 110, no neck is formed in the MSM element 110.

Referring to FIG. 3B, the predominant direction 302 of the combined rotating magnetic field is depicted for the time labeled B in FIG. 2. At the time labeled B, the first normalized magnetic field 242 may have an approximate value of 1.0 in a direction toward the MSM element 110 and the second normalized magnetic field 244 may have an approximate value of 0.0. The vector combination of the normalized magnetic fields 242, 244 may result in the predominant direction 302 being at a 45° angle toward the MSM element. Because the predominant direction 302 of the combined rotating magnetic field is directed toward the second end 118 of the MSM element 110, having magnetic field components that are perpendicular to the MSM element 110, the combined magnetic flux may cause a neck to form at the second end 118.

Figure 3C:
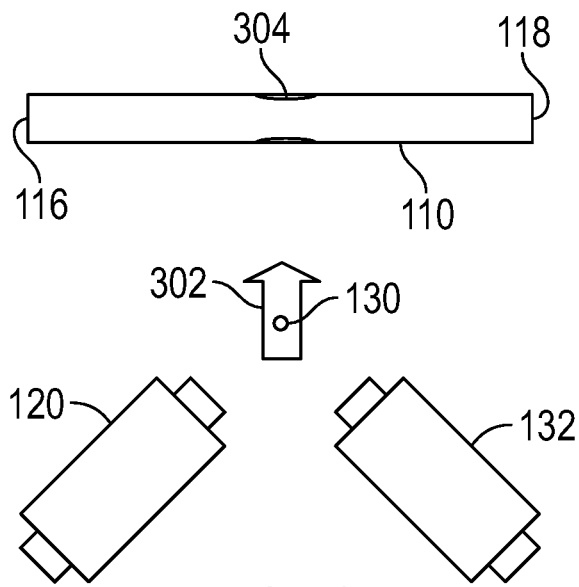

Referring to FIG. 3C, the predominant direction 302 of the combined rotating magnetic field is depicted for the time labeled C in FIG. 2. At the time labeled C, the first normalized magnetic field 242 may have an approximate value of √2/2 (0.707) in a direction toward the MSM element 110 and the second normalized magnetic field 244 may also have an approximate value of √2/2 (0.707) in a direction toward the MSM element 110. The vector combination of the normalized magnetic fields 242, 244 may result in the predominant direction 302 being at a 90° angle toward the MSM element. Because the changes in the first normalized magnetic field 242 and the changes in the second normalized magnetic field 242 are continuous and sinusoidal, the neck 304 may continuously move along the MSM element 110 to the center of the MSM element 110 at time C.

Figure 3D:
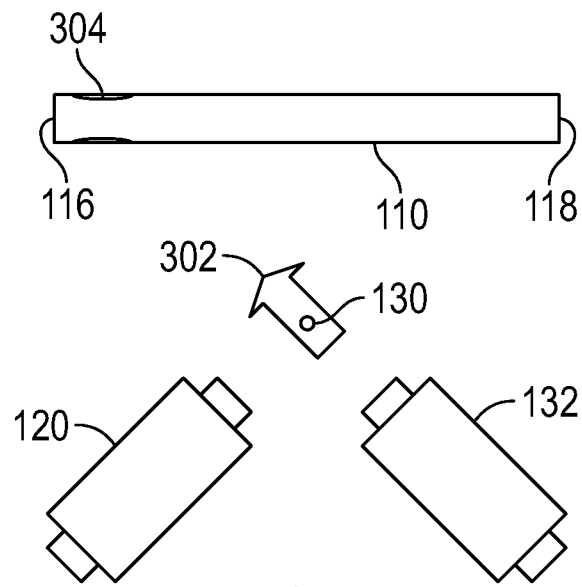
Figure 3E:
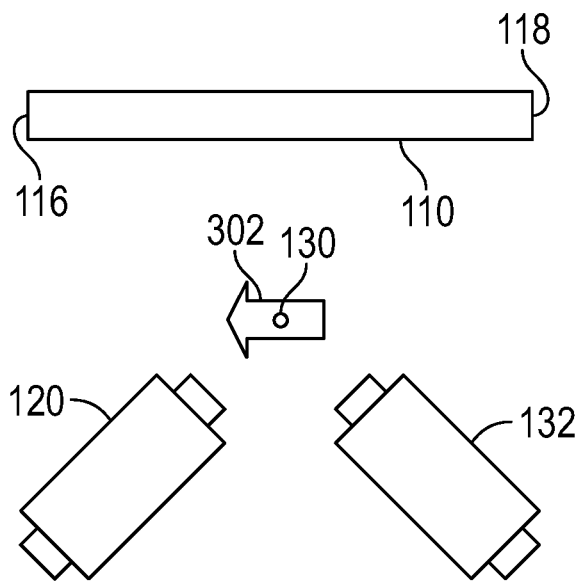

Referring to FIG. 3D, the predominant direction 302 of the combined rotating magnetic field is depicted for the time labeled D in FIG. 2. At the time labeled D, the first normalized magnetic field 242 may have an approximate value of 0.0 and the second normalized magnetic field 244 may have an approximate value of 1.0 in a direction toward the MSM element 110. The vector combination of the normalized magnetic fields 242, 244 may result in the predominant direction 302 being at a 45° angle toward the MSM element and the neck 304 may be continuously moved to the first end 116 of the MSM element 110 at time D.

Referring to FIG. 4E, a predominant direction 302 of a combined rotating magnetic field is depicted for the time labeled E in FIG. 2. At the time labeled E, the first normalized magnetic field 242 may have an approximate value of −√2/2 (−0.707) in a direction away from the MSM element 110 and the second normalized magnetic field 244 may have an approximate value of √2/2 (0.707) in a direction toward the MSM element. The vector combination of the normalized magnetic fields 242, 244 may result in the predominant direction 302 being horizontal to the MSM element and running from the second end 118 to the first end 116. Because the predominant direction 302 of the combined rotating magnetic field is parallel to the MSM element 110, no neck is formed in the MSM element 110.

Figure 3F:
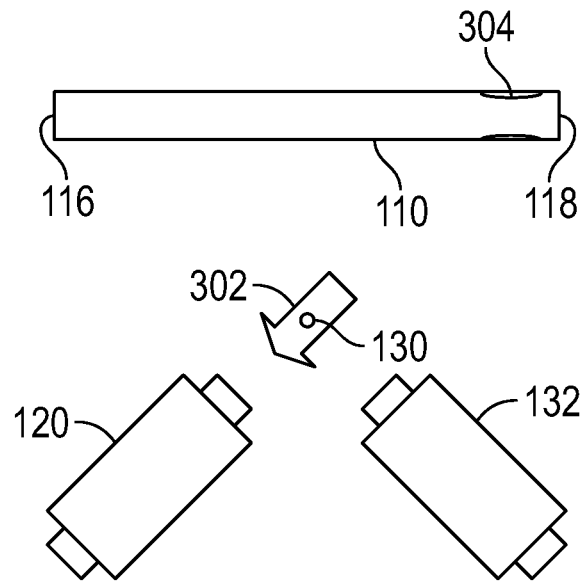

The cycle may then continue in FIGS. 3F, 3G, and 3H with the neck 340 continuously moving from the second end 118 of the MSM element 110 to the first end 116. A difference between FIGS. 3A-3D and FIGS. 3E-3H is that the polarity of the combined rotating magnetic flux may be reversed in FIGS. 3A-3D as compared to FIGS. 3E-3H. As such, predominant direction 302 may be opposite. However, the neck 340 may still form in the MSM element 110 because it is formed based on the perpendicularity of a magnetic field rather than the polarity.

A benefit of the system 100 is that it may reduce the electrical power needed to drive the actuation device as compared to a system that uses additional electrical coils in a linear configuration, reversing a current in the coils to produce a neck in a portion of an MSM element. Having a lower current density, the system 100 may be operated without active cooling. Further, controlling algorithms used by the controller 140 may be simplified as compared to other micropumps. Also, the system 100 may be implemented with fewer components, reducing its associated size and weight. Other benefits may exist.

Figure 4:
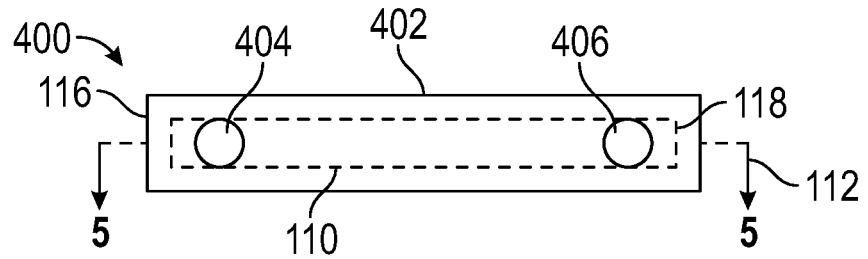
FIG. 4 is a top view of a schematic diagram depicting an MSM micropump system.
Figure 5:
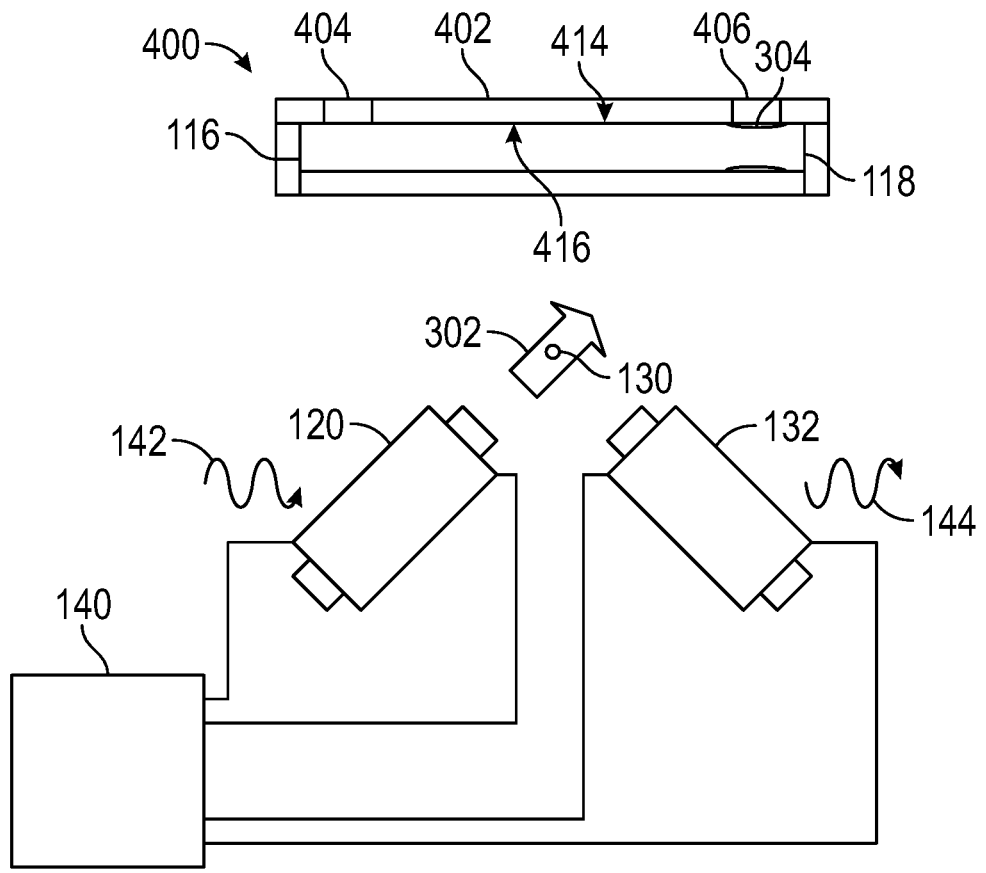
FIG. 5 is a side view of a schematic diagram depicting an MSM micropump system with a pump housing and MSM element shown in cross-section.

Referring to FIG. 4, an embodiment of an MSM micropump system 400 is depicted. FIG. 4 is a top view of the system 100. For clarity, FIG. 4 omits some additional elements of the system 400, such as the solenoids 120, 132 and the controller 140, which are depicted in FIG. 5. As shown in FIG. 4, the system 400 may include a pump housing 402 with a first port 404 and a second port 406 defined therein. The ports 404, 406 may be openings within the pump housing 402 used for fluid inlets and/or outlets. MSM element 110 may be positioned within the pump housing 402 with the first end 116 of the MSM element 110 being associated with the first port 404 the second end 118 of the MSM element 110 being associated with the second port 406.

Referring to FIG. 5, the MSM micropump system 400 is depicted in a side view with the pump housing 402 and MSM element 110 shown in cross-section. In the system 400, a surface 414 of the MSM element 110 may be flush with and in contact with a surface 416 of the pump housing, thereby blocking fluid flow between the ports 404, 406.

During operation, the controller 140 may send the first AC signal 142 to the first solenoid 120 and the second AC signal 144 to the second solenoid 132. In response to the AC signals 142, 144, the solenoids 120, 132 may produce a magnetic flux that rotates around the point 130, having a rotating predominant direction 302. In response to the predominant direction 302 having a significant vertical component (i.e., perpendicular to the MSM element 110), the neck 304 may form in the MSM element 110. Fluid may be admitted into a cavity formed by the neck 304 between the surface 414 of the MSM element 110 and the surface 416 of the pump housing 402. As the predominant direction 302 of the rotating magnetic flux rotates, the neck 304 may move along the MSM element 110, from the first end 116 to the second end 118 or from the second end 118 to the first end 116 depending on the direction of rotation. Thus, fluid may be transported between the ports 404, 406.

A benefit of the MSM micropump system 400 is that by using only two solenoids 120, 132 to create a rotating magnetic flux, the system 400 may be lighter and less complex than other micropump systems. This may make the micropump system 400 more useful for medical applications which may use the MSM micropump system 400 for small dosing requirements. Other advantages may exist.

Figure 6:
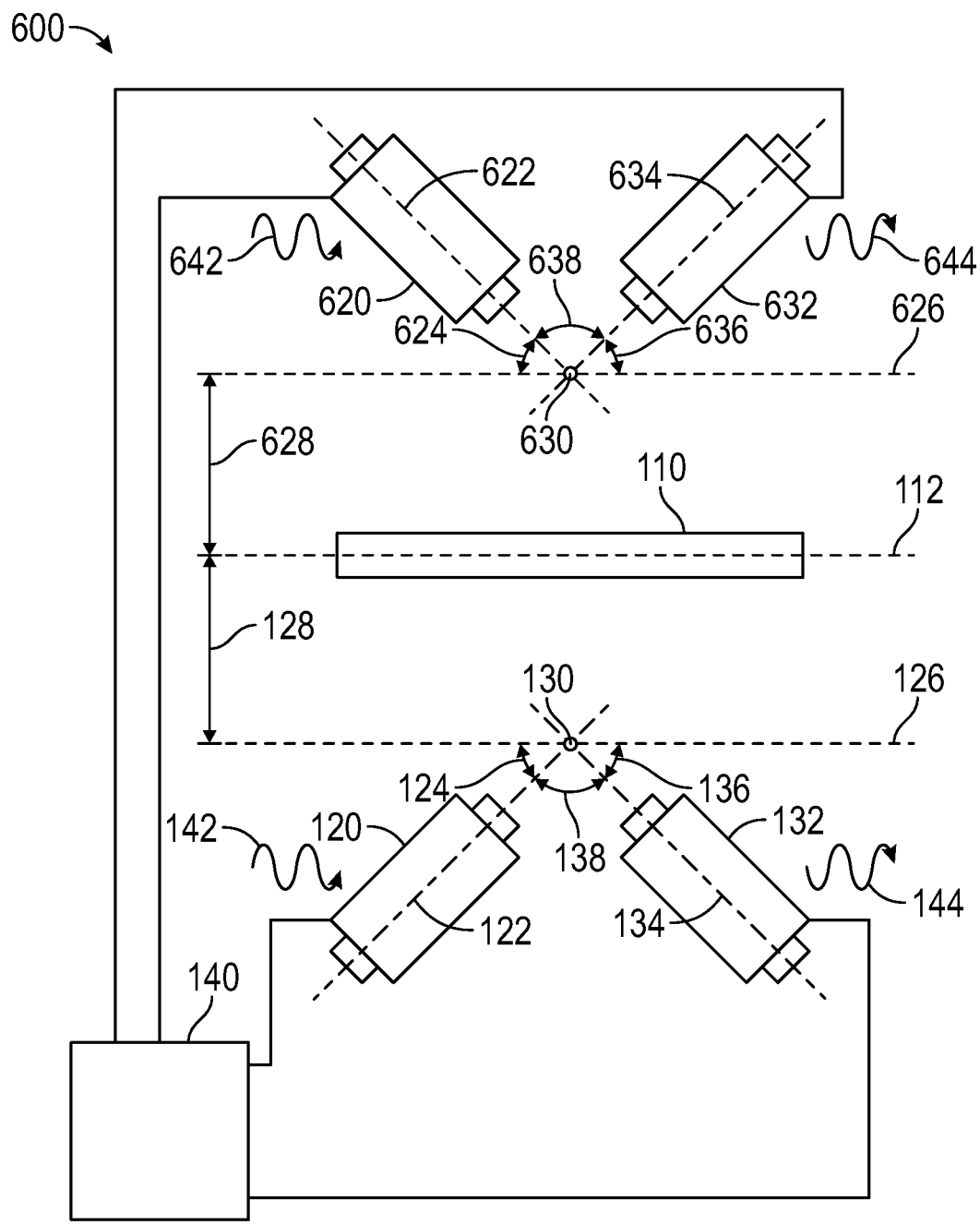
FIG. 6 is a schematic diagram of an embodiment of an MSM actuation system with symmetrical solenoids.

Referring to FIG. 6, an embodiment of an MSM actuation system 600 is depicted. In addition to the system 100 may include a third solenoid 620 and fourth solenoid 632. The third solenoid 620 may have a third longitudinal axis 622 and the fourth solenoid 632 may have a fourth longitudinal axis 634. As shown in FIG. 6, the third and fourth solenoids 620, 632 may be positioned symmetrically to the first and second solenoids 120, 132 with respect to the long axis 112 of the MSM element 110.

A longitudinal axis 622 of the third solenoid 620 and a longitudinal axis 634 of the fourth solenoid 632 may intersect at a second point 630. The second point 630 may be proximate to the MSM element 110. A second distance 628 between the second point 630 and the long axis 112 of the MSM element 110 may be equal to the distance 128 between the point 130 and the long axis 112. In cases where the point 130 may coincide with the long axis 112 of the MSM element, the second point 630 may equal the point 130. A second parallel axis 626 is shown in FIG. 6 to aid in demonstrating angles between the third and fourth solenoids 620, 632 and the MSM element 110.

The longitudinal axis 622 of the third solenoid 620 may be positioned at a fourth angle 624 relative to the long axis 112 of the MSM element 110, which may equal the first angle 124. The longitudinal axis 634 of the fourth solenoid 632 may be positioned at a fifth angle 636 relative to the long axis 112 of the MSM element 110, which may equal the second angle 136. The longitudinal axis 634 of the fourth solenoid 632 may also be positioned at a sixth angle 638 relative to the longitudinal axis 622 of the third solenoid 620, which may equal the third angle 138.

During operation, the controller 140 may provide the first AC signal 142 to the first solenoid 120 and the second AC signal 144 to the second solenoid 132, with the AC signals 142, 144 having a 90° phase difference. The controller 140 may also provide a third AC signal 642 to the third solenoid 620 and a fourth AC signal 644 to the fourth solenoid 632. The third AC signal 642 may be an inverted form of the first AC signal 142 and the fourth AC signal may be an inverted form of the second AC signal 144.

By including the additional solenoids 620, 632, the magnetic field at the MSM element 110 may be strengthened, thereby resulting in a stronger actuation of the MSM element 110. Other advantages may exist.

Figure 7:
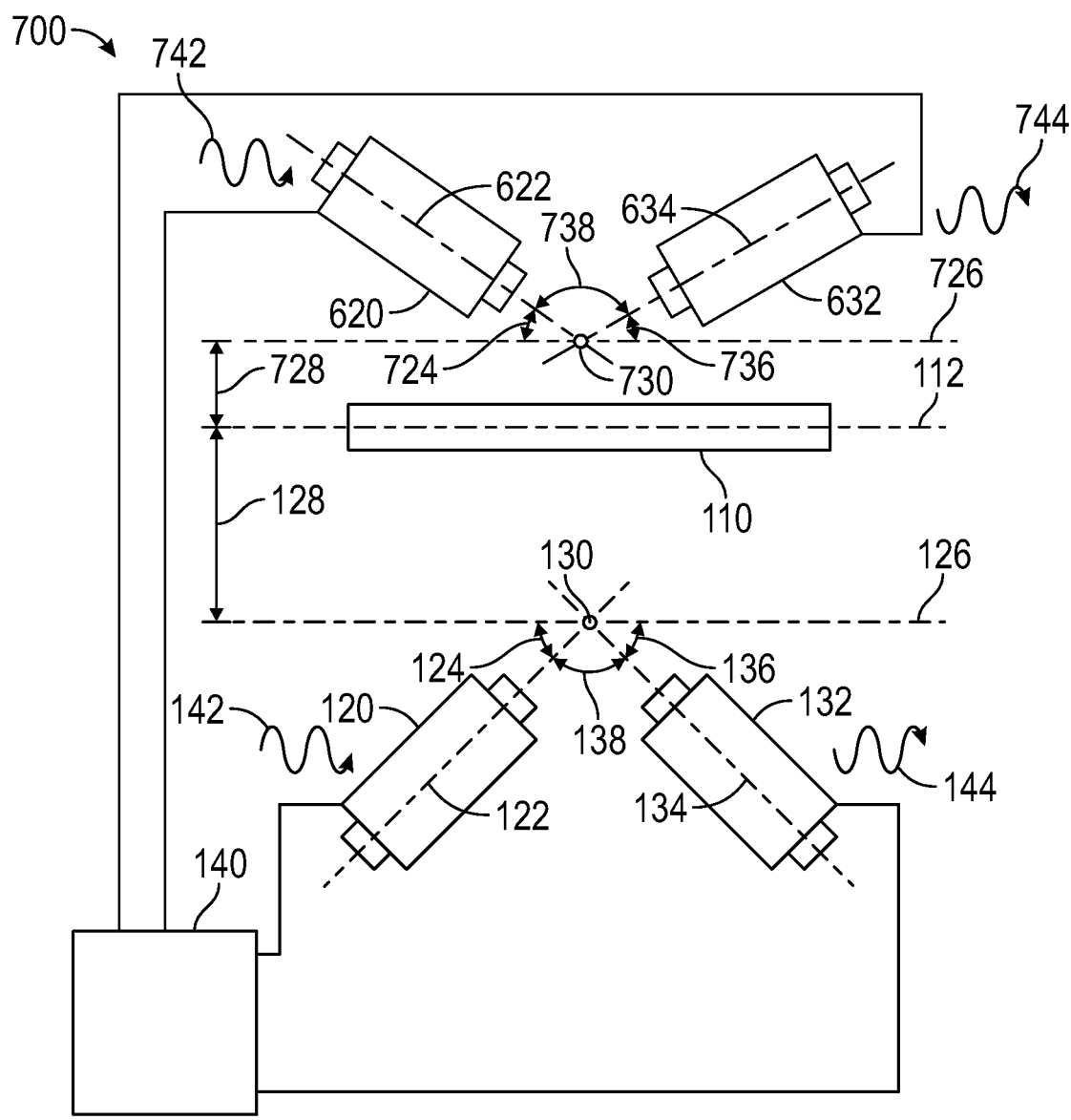
FIG. 7 is a schematic diagram of an embodiment of an MSM actuation system with asymmetrical solenoids.

Referring to FIG. 7, an embodiment of an MSM actuation system 700 is depicted. As shown in FIG. 7, the third and fourth solenoids 620, 632 may be positioned asymmetrically to the first and second solenoids 120, 132 with respect to the long axis 112 of the MSM element 110.

A longitudinal axis 622 of the third solenoid 620 and a longitudinal axis 634 of the fourth solenoid 632 may intersect at a third point 730. The third point 730 may be proximate to the MSM element 110, however, a third distance 728 between the third point 630 and the long axis 112 of the MSM element 110 may be greater than or less than the distance 128 between the point 130 and the long axis 112. A third parallel axis 726 is shown in FIG. 7 to aid in demonstrating angles between the third and fourth solenoids 620, 632 and the MSM element 110.

The longitudinal axis 622 of the third solenoid 620 may be positioned at a seventh angle 724 relative to the long axis 112 of the MSM element 110, which may greater than or less than the first angle 124. The longitudinal axis 634 of the fourth solenoid 632 may be positioned at an eighth angle 736 relative to the long axis 112 of the MSM element 110, which may be greater than or less than the second angle 136. The longitudinal axis 634 of the fourth solenoid 632 may also be positioned at a ninth angle 738 relative to the longitudinal axis 622 of the third solenoid 620, which may be greater than or less than the third angle 138.

During operation, the controller 140 may provide the first AC signal 142 to the first solenoid 120 and the second AC signal 144 to the second solenoid 132, with the AC signals 142, 144 having a substantially 90° phase difference. The controller 140 may also provide a fifth AC signal 742 to the third solenoid 620 and a sixth AC signal 744 to the fourth solenoid 632. The fifth AC signal 742 and the sixth AC signal 744 may be formed to perform fine tuning of the magnetic field applied to the MSM element 110.

By including the additional solenoids 620, 632 in an asymmetrical pattern, the magnetic field at the MSM element 110 may be tuned to result in more consistency in the actuation of the MSM element 110. Other advantages may exist.

Figure 8:
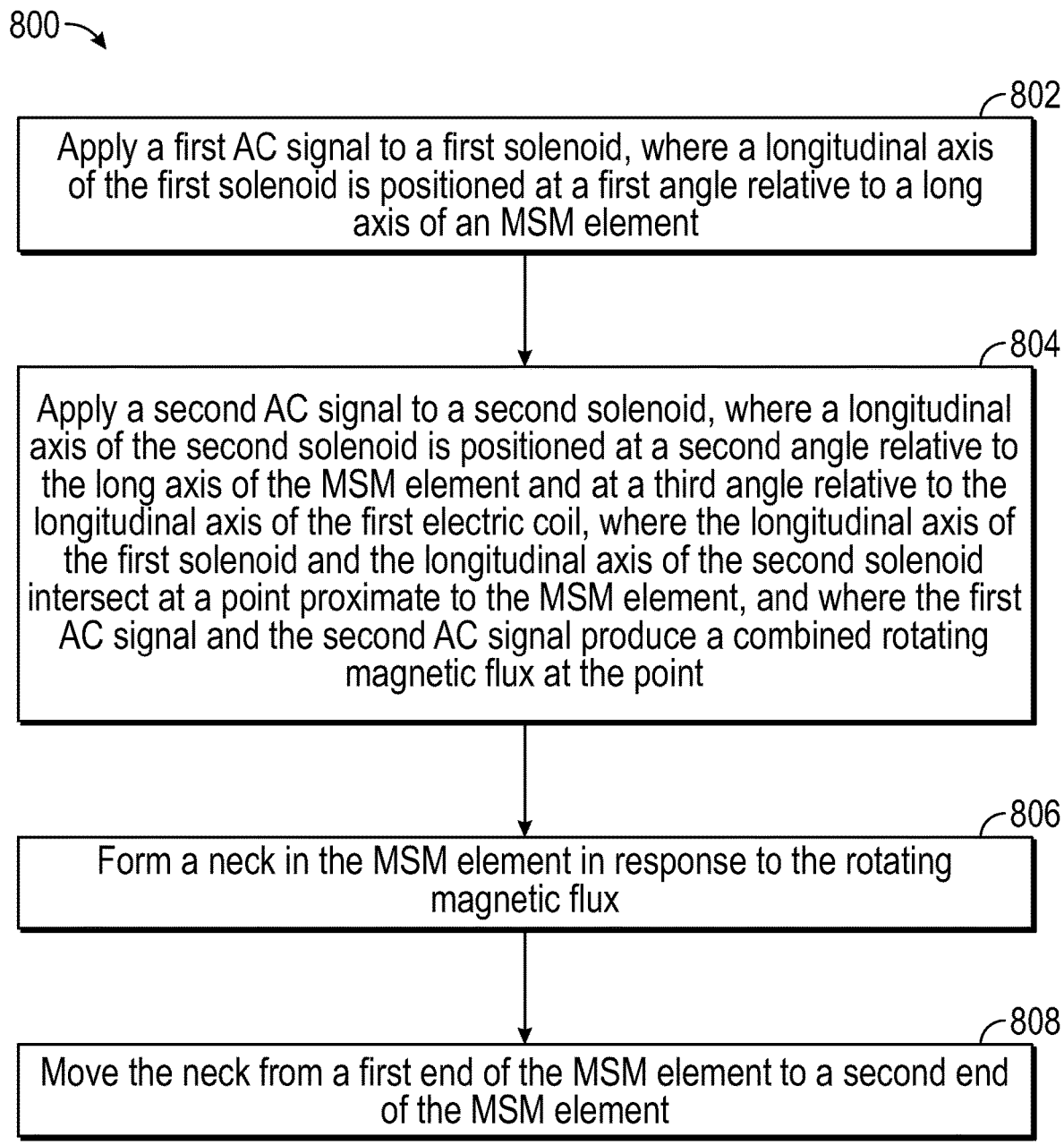
FIG. 8 is a flow diagram of an embodiment of an MSM actuation method.

Referring to FIG. 8, an embodiment of an MSM actuation method 800 is depicted. The method 800 may include applying a first AC signal to a first solenoid, where a longitudinal axis of the first solenoid is positioned at a first angle relative to a long axis of an MSM element, at 802. For example, the first AC signal 142 may be applied to the first solenoid 120.

The method 800 may further include applying a second AC signal to a second solenoid, where a longitudinal axis of the second solenoid is positioned at a second angle relative to the long axis of the MSM element and at a third angle relative to the longitudinal axis of the first solenoid, where the longitudinal axis of the first solenoid and the longitudinal axis of the second solenoid intersect at a point proximate to the MSM element, and where the first AC signal and the second AC signal produce a combined rotating magnetic flux at the point, at 804. For example, the second AC signal 144 may be applied to the second solenoid 132.

The method 800 may also include forming a neck in the MSM element in response to the rotating magnetic flux, at 806. For example, the neck 304 may be formed.

The method 800 may include moving the neck from a first end of the MSM element to a second end of the MSM element, at 808. For example, the neck 304 may be moved from the first end 116 of the MSM element 110 to the second end 118 or from the second end 118 to the first end 116.

A benefit of the method 800 is that actuation (e.g., the formation and movement of the neck 304) may be performed using fewer coils and with less complexity as compared to MSM actuation methods that rely on permanent magnets and/or several linearly-placed electric coils. Other benefits may exist.

Although various embodiments have been shown and described, the present disclosure is not so limited and will be understood to include all such modifications and variations as would be apparent to one skilled in the art.

What is claimed is:

1. A system comprising:
 a magnetic shape memory (MSM) element having a long axis that extends from a first end of the MSM element to a second end of the MSM element;
 a first solenoid, wherein a longitudinal axis of the first solenoid is positioned at a first angle relative to the long axis of the MSM element; and
 a second solenoid, wherein a longitudinal axis of the second solenoid is positioned at a second angle relative to the long axis of the MSM element and at a third angle relative to the longitudinal axis of the first solenoid, wherein the longitudinal axis of the first solenoid and the longitudinal axis of the second solenoid are not parallel.

2. The system of claim 1, further comprising:
 a pump housing having an inlet and an outlet, wherein the long axis of the MSM element extends from the inlet to the outlet.

3. The system of claim 1, further comprising a controller configured to apply a first alternating current (AC) signal to the first solenoid and a second AC signal to the second solenoid, wherein the first AC signal and the second AC signal produce a combined rotating magnetic flux that causes a localized neck to form in the MSM element and to move from the first end to the second end.

4. The system of claim 3, wherein the first AC signal and the second AC signal have a same amplitude and a same frequency, and wherein the first AC signal and the second AC signal have a substantially 90° phase difference.

5. The system of claim 1, wherein the first angle is between 30° and 60°, wherein the second angle is between 30° and 60°, and wherein the third angle is between 60° and 120°.

6. The system of claim 1, wherein the first angle is 45°, the second angle is 45°, and the third angle is 90°.

7. The system of claim 1, wherein the longitudinal axis of the first solenoid and the longitudinal axis of the second solenoid intersect at a point proximate to the MSM element.

8. The system of claim 1, further comprising:
 one or more additional solenoids, wherein longitudinal axes of the additional solenoids are positioned at additional angles relative to the long axis of the MSM element.

9. The system of claim 8, wherein the one or more additional solenoids includes two solenoids positioned symmetrically with the first solenoid and the second solenoid.

10. The system of claim 8, wherein the one or more additional solenoids includes two solenoids positioned asymmetrically with the first solenoid and the second solenoid.

11. A system comprising:
 a magnetic shape memory (MSM) element having a long axis that extends from a first end of the MSM element to a second end of the MSM element;
 a first solenoid, wherein a longitudinal axis of the first solenoid is positioned at a first angle between 30° and 60° relative to the long axis of the MSM element; and
 a second solenoid, wherein a longitudinal axis of the second solenoid is positioned at a second angle between 30° and 60° relative to the long axis of the MSM element and at a third angle between 60° and 120° relative to the longitudinal axis of the first solenoid, wherein the longitudinal axis of the first solenoid and the longitudinal axis of the second solenoid intersect at a point proximate to the MSM element.

12. The system of claim 11, further comprising:
 a pump housing having an inlet and an outlet, wherein the long axis of the MSM element extends from the inlet to the outlet.

13. The system of claim 11, further comprising a controller configured to apply a first alternating current (AC) signal to the first solenoid and a second AC signal to the second solenoid, wherein the first AC signal and the second AC signal produce a combined rotating magnetic flux that, rotates around the point and causes a localized neck to form in the MSM element and to move from the first end of the MSM element to the second end of the MSM element.

14. The system of claim 13, wherein the first AC signal and the second AC signal have a same amplitude and a same frequency, and wherein the first AC signal and the second AC signal have a substantially 90° phase difference.

15. The system of claim 11, wherein the first angle is 45°, the second angle is 45°, and the third angle is 90°.

16. A method comprising:
applying a first alternating current (AC) signal to a first solenoid, wherein a longitudinal axis of the first solenoid is positioned at a first angle relative to a long axis of a magnetic shape memory (MSM) element; and
applying a second AC signal to a second solenoid, wherein a longitudinal axis of the second solenoid is positioned at a second angle relative to the long axis of the MSM element and at a third angle relative to the longitudinal axis of the first solenoid, wherein the longitudinal axis of the first solenoid and the longitudinal axis of the second solenoid intersect at a point proximate to the MSM element, and wherein the first AC signal and the second AC signal produce a combined rotating magnetic flux at the point.

17. The method of claim 16, further comprising:
forming a neck in the MSM element in response to the combined rotating magnetic flux; and
moving the neck from a first end of the MSM element to a second end of the MSM element.

18. The method of claim 17, wherein the long axis of the MSM element extends from an inlet of a pump housing to an outlet of the pump housing, the method further comprising:
moving the neck from the inlet to the outlet.

19. The method of claim 18, further comprising:
moving a fluid from the inlet to the outlet using the neck.

20. The method of claim 16, wherein the first AC signal and the second AC signal have a same amplitude and a same frequency, the method further comprising:
shifting the first AC signal or the second AC signal to produce a 90° phase difference between the first AC signal and the second AC signal.

21. The method of claim 16, further comprising:
applying one or more additional AC signals to one or more additional solenoids.

* * * * *